United States Patent [19]

White

[11] Patent Number: 4,902,546
[45] Date of Patent: Feb. 20, 1990

[54] TRANSFER METALLIZATION LAMINATE

[75] Inventor: David J. White, Framingham, Mass.

[73] Assignee: Dennison Manufacturing Company, Framingham, Mass.

[21] Appl. No.: 852,581

[22] Filed: Apr. 16, 1986

[51] Int. Cl.$^4$ .................. A61F 13/02; E04F 15/16; B44C 1/16

[52] U.S. Cl. ........................... 428/40; 428/914; 156/233

[58] Field of Search ............... 428/200, 202, 352, 914, 428/457, 458, 40; 40/2 R; 156/230, 233, 234, 238, 239, 241, 247, 249, 246

[56] References Cited

U.S. PATENT DOCUMENTS

| | | | |
|---|---|---|---|
| 3,235,395 | 2/1966 | Scharf | 156/233 |
| 3,912,569 | 10/1975 | Kapral | 156/240 |
| 3,984,598 | 10/1976 | Sarazin et al. | 156/246 |
| 4,012,552 | 3/1977 | Watts | 156/233 |
| 4,234,643 | 11/1980 | Grotefend et al. | 428/200 |
| 4,376,006 | 3/1983 | Nishikawa et al. | 156/233 |
| 4,382,831 | 5/1983 | Clough et al. | 156/249 |
| 4,517,235 | 5/1985 | Ungar et al. | 156/230 |
| 4,555,436 | 11/1985 | Geurtsen et al. | 428/200 |

FOREIGN PATENT DOCUMENTS

WO79-0103 3/1979 World Int. Prop. O. .......... 156/233

Primary Examiner—Michael W. Ball
Assistant Examiner—Louis Falasco
Attorney, Agent, or Firm—Barry D. Josephs; George E. Kersey

[57] ABSTRACT

Method and apparatus for the metallization of support members, such as paper sheeting and other cellulosic products. A metallic film is transferred to the paper support from a cellulosic carrier and adhered to the paper by a thermoplastic material. The cellulosic carrier, with a releasably adhered film of metal, is brought into contact with a paper support and an intervening thermoplastic adhesive. Pressure and/or heat is applied to the composite which is subsequently cooled and the carrier stripped away to leave the desired metallic layer on the receiving surface of the paper support.

This transfer procedure overcomes the objections associated with plastic carriers and is particularly suitable for metallizing support members, like paper, which are otherwise difficult to metallize.

9 Claims, 1 Drawing Sheet

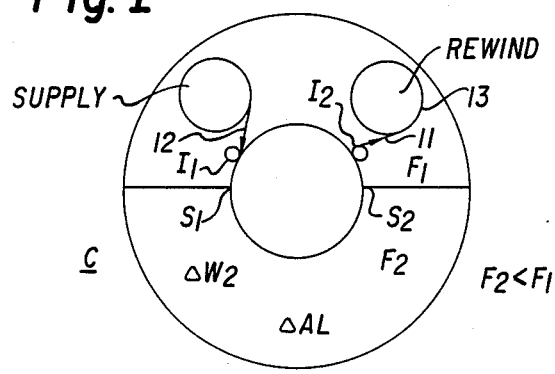
Fig. 1
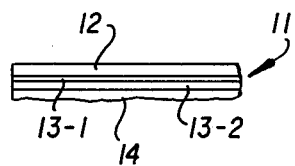
Fig. 2
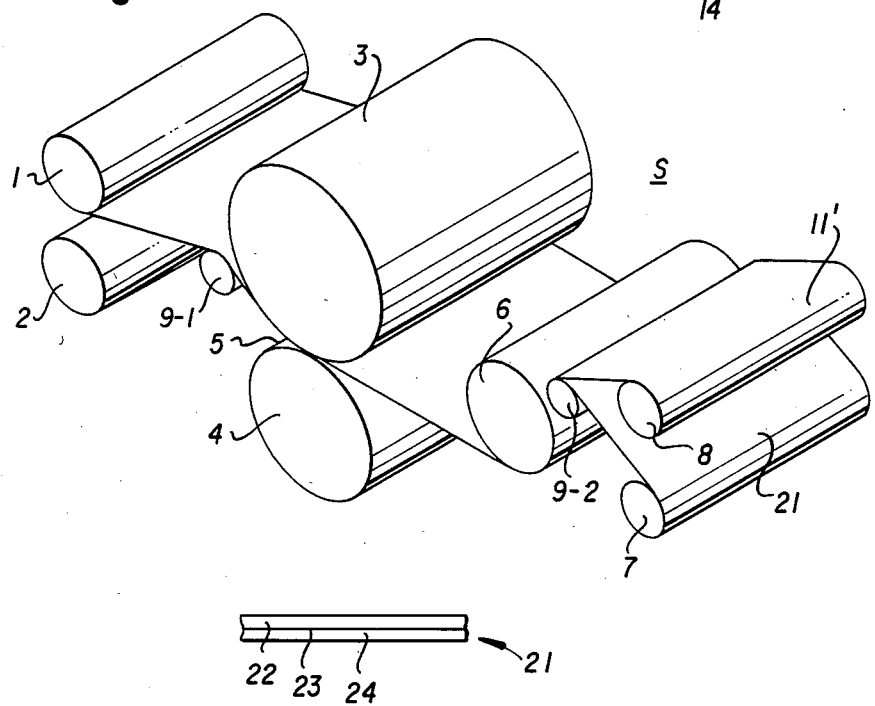
Fig. 3
Fig. 4

TRANSFER METALLIZATION LAMINATE

BACKGROUND OF THE INVENTION

This invention relates to the metallization of support members and, more particularly, to the metallization of cellulosic support members such as paper.

Metallization is a process in which a metallic material, such as aluminum, is applied to an underlying support member. This can be done by bonding a thin film of metallic foil to the surface of the support member. The bonding takes place using a suitable adhesive and the resulting product is a laminate of the support material and the foil.

Alternatively, metal is vaporized in a high vacuum using resistance, induction or an electron beam and forms a metallic layer on a support member. This procedure is suitable only for support members that do not contain significant amounts of moisture. When moisture is present, the vacuum draws vapors and other by-products which must be eliminated before subsequent metallizing can take place. Irregularities in the support surface also appear in the final product.

As a result, where it is desired to employ a vacuum for the direct metallization of a paper support member, the paper is first dried to a level where there will be negligible outgassing. This procedure, however, makes the support material brittle and difficult to process. Additionally, once the vacuum metallization of the dried paper is completed, it is necessary to restore its moisture level to near its original value. This is a time consuming and costly procedure that requires the use of appreciable amounts of energy for drying.

Accordingly it is an object of the invention to facilitate the metallization of support members. particularly cellulosic products such as paper. A related object is to facilitate the metallization of support members with irregular surfaces. Another related object is to achieve suitable metallization of support members that exhibit outgassing when subjected to a vacuum.

Another object of the invention is to achieve suitable smoothness and reflectivity for metallized support surfaces.

Still another object of the invention is to achieve efficient and high speed metallization of support members.

Still other objects of the invention are to overcome the disadvantages associated with metallization by foil lamination and direct metallization by vacuum.

SUMMARY OF THE INVENTION

In accomplishing the foregoing and related objects, the invention provides a metallization method in which a support member, such as paper sheeting, receives a metallic film that is released from a cellulosic sheet carrier. The carrier is provided with mutually releasable thermoset layers and an overlying metallic film. The metallic film becomes adhered to the paper support by a thermoplastic material. The latter serves to compensate for any irregularities in the support surface, and the transferred metallic film is provided with a suitable degree of smoothness by virtue of its contact with a smooth mating surface of the cellulosic carrier, which is describing of the super calendered variety.

In accordance with one aspect of the invention the thermoplastic adhesive layer is applied to the composite of the support member and the metallized plastic carrier. The thermoplastic layer in the composite is then caused to flow, by, for example, being subjected to pressure and/or heat. The pressure and/or heating effect is sufficient to produce flow in the thermoplastic layer short of melting. The composite is thereafter cooled and the plastic sheet stripped away to leave the support member with the metallic film adhered to it by the thermoplastic layer.

In accordance with still another aspect of the invention the support member and the carrier are of cellulosic material which is prepared from either mechanical or chemical pulp. The cellulosic sheet desirably is size-press coated on at least the receiving surface for metallization with a water dispersion of clay and resin. The resin is advantageously aqueous styrene butadiene.

In accordance with a further aspect of the invention the thermoplastic adhesive layer is selected from the class consisting of styrenes, styrene-polyolefin mixtures, acrylics, polyamides, nitro-styrenes, vinyl acetate and copolymers including ethylene vinyl acetates, vinyl chlorides and plasticized nitrocelluloses. A particularly suitable thermoplastic layer is a mixture of styrene and vinyl resins being, for example, 80 parts styrene butadiene and 20 parts vinyl acetate, or 80 parts styrene and 20 parts ethylene vinyl acetate.

In accordance with yet another aspect of the invention the thermoplastic material that serves as the adhesive includes a viscosity modifier selected from the class consisting of amine esters, sulphated oils, colloidal silicas, polyoxyalkylene fatty acid esters, starches, carboxylated cross linked acrylic emulsions, methyl vinyl ether maleic anhydrides and carboxylated methyl acelluloses. One part of the viscosity modifier is desirably included with each 100 part of thermoplastics. The viscosity modifier thermoplastic is prepared. A coating emulsion that desirably ranges between 20 and 60 percent solids and is advantageously 38 percent solids.

In accordance with a still further aspect of the invention the thermoplastic is rendered flowable by being subjected to pressure at the nip of two rollers which provide a force in the range from about 200 to 1000 pounds per linear inch, preferably 600 pounds per linear inch.

In accordance with a yet further aspect of the invention the metallizable member is a support with or without a thermoplastic layer and the transfer member is a coated cellulosic sheet with a metallic layer.

In accordance with still another aspect, the invention can be used for the metallization of support members in the form of paper board having a basis weight in the range from 100 to 400 grams per square meter. This kind of metallization cannot be accomplished by conventional techniques.

DESCRIPTION OF THE DRAWINGS

Other aspects of the invention will become apparent after considering several illustrative embodiments, taken in conjunction with the drawings in which:

FIG. 1 is a schematic view of a four-zone direct metallization chamber for preparing a metallized carrier in accordance with the invention;

FIG. 2 is a portion of a metallized carrier produced by the chamber of FIG. 1;

FIG. 3 is a fragmentary perspective view of a metallization system in accordance with the invention; and FIG. 4 is a fragmentary sectional view of a thermoplastic coated receiver or support sheet for use in the system of FIG. 1.

DETAILED DESCRIPTION

With reference to the drawings, a metallization chamber C for use in accordance with the invention is shown in fragmentary outline in FIG. 1 to achieve metallization of a super calendered, cellulosic carrier 12 (FIG. 2).

A supply drum in the chamber C has the carrier sheet 12 extended over an idler roll $I_1$ around the periphery of a water cooled drum, and then about a second idler roll $I_2$ to a rewind drum. The chamber C is divided into two zones, the first zone, which is semicylindrical, is at a pressure $F_1$ and the remaining semicylindrical zone is at a pressure $F_2$, lower than pressure $F_1$.

In the first zone, which may be at a pressure as high 0.1 Torr to 0.01 Torr outgassing takes place. Before the sheet 12 is inserted in the supply roll, it is cooled with multiple layers, at least two, 13-1 and 13-2 (FIG. 2), of a thermoset resin at least two of the thermoset layers are materially releasable. In the second zone, a second thermoset 13-2 resin is evaporated (dispersible $AW_2$.

Conventional seals $S_1$ and $S_2$ are used to retain the pressure differential between the two portions of the chamber C where the sheet 12 from the supply drum enters and then leaves as metallized sheet 11. In the metallizing portion, metal, for example aluminum, is vaporized as represented by the symbol $\Delta$ AL and allowed to accumulate and form the metallic layer 13. As can be seen from the detailed fragment in FIG. 2, the metallized carrier 11 includes a cellulosic substrate 12, a first thermoset layer 13-1, a second thermoset layer 13-2 and a metallic coating 14.

The metallic carrier 11 is illustratively employed in system S of FIG. 3 which makes use of two supply rolls 1 and 2, a heated drum 3, a contacting resilient drum 4, a water cooled drum 6 and rewind rolls 7 and 8.

The supply roll 1 carries a wound carrier metallized sheet 11. The metallic side of the sheet 11 faces or carries a thermoplastic coating with respect to a support sheet 21 that is supplied from the lower supply drum 2. A specific structure of the coated receiving sheet 21 is shown in detail in FIG. 4. As indicated, the coated paper sheet 21 is constituted by a base paper layer 22, a thermoplastic coating 24, and diffusion bonding layer 23 between the thermoplastic coating 24, and the base paper 22.

The metallized carrier 11 on the upper supply drum 1 is unrolled and extended over an intervening idler roll 9-1 to the lower surface of the heated drum 3, with the thermoplastic layer 24 facing the metallic coating 13 of the sheet 11 in FIG. 1.

The receiving or support sheet 21 from the lower supply drum 2 also extends to the intervening idler roll 9-1 where its thermoplastic side makes contact with the metallized surface of the carrier 11. The two sheets 11 and 21 then extend in contact with one another to the heated drum 3 where pressure is applied by the resilient drum 4 at the nip 5. The drum 4 can be heated and be of any suitable construction as long as its surface provides suitable resiliency. The composite of the carrier 11 and the support 21 extends from the nip 5 to the lower surface of the water cooled drum 6. The purpose of the drum 6 is to lower the temperature of the composite to a suitable level before separation of the two sheets 11 and 21 takes place at the upper surface of a second idler roll 9-2.

The separated sheets are wound on respective takeup rolls 7 and 8 with the sheet 11' on the upper roll 8 being devoid of its metallic layer and the second thermoset layer which have been transferred to the metallized sheet 21' that is wound on the lower roll 7. The resulting metallized sheeting 21' is subsequently removed with the lower roll 7.

It will be understood that the various rolls 1, 2, 9-1, 9-2, 7 and 8 are supported in conventional fashion. The various rolls are also of a diameter that is appropriate for the stock being processed. As the basis weight of the stock increases, the diameters of the associated rolls are increased correspondingly. In addition, heating of the drum 3 and water cooling of the drum 6 are accomplished conventionally. Heating of the drum 3 is unnecessary when the pressure between the drums 3 and 4 is sufficient to render the thermoplastic flowable. The combination of heat and pressure, however, is desirable to accentuate this result.

The invention is further illustrated with reference to the following illustrative examples which are to be taken as nonlimiting.

EXAMPLE I

Ground wood (mechanical pulp) paper sheeting of standard basis weight is size-press coated in conventional fashion. The coated paper sheeting is then provided with a thermoplastic layer having a weight of 4 grams per square meter.

Cellulosic sheeting that has a metallic layer with a thickness of about 200 angstroms and underlying and mutually releasable thermoset layers, has its metallic surface brought into contact with the thermoplastic layer of the paper sheeting and subjected to pressure and heat to render the thermoplastic flowable.

The composite of the thermoplastic layer paper sheeting and the metallized cellulosic sheeting is then cooled and the sheeting peeled away, transferring the metallic layer, with one of the thermoset layers, to the paper sheeting by virtue of the adhesive effect of the thermoplastic layer.

The result is a metallized sheet of paper with a high and acceptable degree of reflectivity.

EXAMPLE II

Example I is repeated with the thermoplastic layer on the metallic layer.

The result in each case is a metallized paper sheet with a high and acceptable degree of reflectivity.

EXAMPLE III

The preceding examples are repeated using ground wood paper sheeting having a basis weight in the range from about 40 to 60 grams per square meter, and preferably about 50 grams per square meter. The results are substantially the same as for Example I.

EXAMPLE IV

Examples I and II are repeated using paper board having a basis weight in the range from about 100 to 400 grams per square meter. The results are substantially the same as for Example I.

EXAMPLE V

Examples I–IV are repeated using a size press coating on at least one side with a water dispersion of clay and resin. The results are substantially the same as for Example I.

EXAMPLE VI

The preceding examples are repeated using a size press coating in which the resin is aqueous styrene butadiene. The results are substantially the same as for Example I.

EXAMPLE VII

The preceding examples are repeated in which the thermoplastic layer is provided by a mixture of styrene and vinyl resins. The results are substantially the same as for Example I.

EXAMPLE VIII

Example VII is repeated using a water-based thermoplastic layer of 80 parts styrene butadiene, for example Dow No. 620, with 20 parts vinyl acetate, for example Borden No. 2142. The results are substantially the same as in Example I.

EXAMPLE IX

The preceding examples are repeated with a viscosity modifier added to the thermoplastic layer. The results are an improvement over those of Example I.

EXAMPLE X

Example IX is repeated using a viscosity modifier selected from the class consisting of amine esters, for example "NAPCO DC 133" of the Napco Chemical Co.; sulphated oils, for example "NAPCO CUSTER" of the Napco Chemical Co.; colloidal silicas, for example "CAB-O-SIL" of Cabot Corp.; polyoxyalkylene fatty acid esters, for example "NONISOL 300" of the Ciba-Geigy Chemical Company; starches, for example "NUFILM H" of the National Starch and Chemical Corp.; carboxylated cross-linked acrylic emulsions, for example "ACRYSOL ASE 60" of the Rohm and Haas Co.; methyl vinyl ether maleic anhydrides, for example "GANTREZ AN-119" of the GAF Corp. Chemical Products; and carboxy methyl celluloses, for example "NATROSOL" 7M, 7L or 7H of Hercules, Inc.

EXAMPLE XI

The preceding examples are repeated with the thermoplastic layer provided by a coating emulsion in water of styrene and ethylene vinyl acetate; a dispersion of ethylene vinyl acetate copolymer in water; or a solvent based ethylene vinyl acetate copolymer (gel-lacquer).

EXAMPLE XII

The preceding examples are repeated with the coated paper sheeting and thermoplastic layer dried to a moisture content in the range from about 2-13 percent, with 6 percent being preferred.

EXAMPLE XIII

The preceding examples are repeated with the paper and the plastic sheeting being advanced during processing at a speed ranging between 200 and 1000 fpm with a speed of 600 fpm being preferred.

EXAMPLE XIV

The preceding examples are repeated with the composite of the coated paper sheeting and the metallized cellulosic sheeting being cooled to about room temperature by a water cooled drum.

EXAMPLE XV

The preceding examples are repeated with chemical pulp paper, achieving the same degree of reflectivity as Example I with less metal.

EXAMPLE XVI

The preceding examples are repeated with at least one of the thermoset layers containing a release agent, such as a silicone fluid.

EXAMPLE XVII example XVI is repeated with both thermoset layers including a release agent.

EXAMPLE XVIII

Examples I and II are repeated with a metallic thickness in the range from about 100 to 500 angstroms.

EXAMPLE XIX

Examples I and II are repeated with a metallic thickness having a resistance in the range from about $\frac{1}{2}$ ohm per square to about 5 ohms per square, with 2 ohms per square being preferred.

EXAMPLE XX

Examples I and II are repeated with the thermoplastic layer being selected from the class consisting of styrenes.

EXAMPLE XXI

Examples I and II are repeated with cross-linked resins.

EXAMPLE XXII

Examples I and II are repeated with cross-linked melamine formaldehyde.

While various aspect of the invention have been set forth by the drawings and the specification, it is to be understood that the foregoing detailed description is for illustration only and that various changes in parts, as well as the substitution of equivalent constituents for those shown and described, may be made without departing from the spirit and scope of the invention as set forth in the appended claims.

I claim:

1. A transfer metallization laminate, which comprises a cellulosic carrier;
   a first thermoset layer upon said carrier;
   a second thermoset layer upon said first layer and a metal film upon said second layer.
2. The laminate of claim 1 further including a thermoplastic layer upon said metallic film.
3. The laminate of claim 2 further including a silicone release in one of the thermoset layers.
4. The laminate of claim 2 further includes a receptor sheet upon said thermoplastic layer.
5. A laminate in accordance with claim 1 wherein said first thermoset layer is melamine formaldehyde.
6. A laminate in accordance with claim 5 wherein said first thermoset layer includes a silicone release.
7. A laminate in accordance with claim 1 wherein said second thermoset layer is melamine formaldehyde.
8. A laminate in accordance with claim 7 wherein said second thermoset layer includes a silicone release.
9. A laminate in accordance with claim 2 wherein both thermoset layers include a silicone release.

* * * * *

UNITED STATES PATENT AND TRADEMARK OFFICE
CERTIFICATE OF CORRECTION

PATENT NO. : 4,902,546

DATED : February 20, 1990

INVENTOR(S) : Daniel J. White

It is certified that error appears in the above-identified patent and that said Letters Patent is hereby corrected as shown below:

On the title page, in item [75], "David" should read --Daniel--.

Signed and Sealed this

Twenty-first Day of January, 1992

*Attest:*

HARRY F. MANBECK, JR.

*Attesting Officer*     *Commissioner of Patents and Trademarks*